United States Patent [19]

Panther

[11] Patent Number: 5,537,676
[45] Date of Patent: Jul. 16, 1996

[54] METHOD OF RECEIVING DATA SIGNALS IN A RADIO TRANSCEIVER USING LOW COST COMPONENTS

[75] Inventor: Gyles Panther, Stittsville, Canada

[73] Assignee: Lanser Technologies Corporation, Quebec, Canada

[21] Appl. No.: 246,781

[22] Filed: May 20, 1994

[51] Int. Cl.$^6$ ........................................ H04B 1/26
[52] U.S. Cl. ........................ 455/315; 455/86; 455/207; 455/209; 455/314
[58] Field of Search .................... 455/84, 85, 86, 455/205, 207, 209, 296, 302, 307, 314, 315, 317, 338, 339

[56] References Cited

U.S. PATENT DOCUMENTS

| | | |
|---|---|---|
| 4,862,175 | 8/1989 | Biggs et al. .......................... 455/315 |
| 5,300,838 | 4/1994 | Elizondo ............................... 455/314 |

Primary Examiner—Reinhard J. Eisenzopf
Assistant Examiner—Doris To
Attorney, Agent, or Firm—Pascal & Associates

[57] ABSTRACT

A method of receiving a data signal in a radio transceiver by passing an input receive signal through an input bandpass filter having a bandwidth sufficient to reject signals with frequencies equal to or greater than the receive signal frequency plus a first intermediate frequency (IF) signal frequency plus a first standard IF signal frequency and also to reject signals with frequencies less than the receive signal frequency minus twice the first IF frequency, and downconverting the input filter filtered input receive signal by the transmit frequency to produce the first IF signal. The first IF signal is filtered in an LC filter, and the filtered first IF signal is mixed with a local oscillator signal having a difference frequency therefrom which is equal to the first standard IF frequency to produce the first standard IF signal. The first standard IF signal is filtered in a standard IF filter, the filtered first standard IF signal is downconverted to a second standard IF frequency signal, and filtering, limiting and discriminating the second standard IF frequency signal by a standard filter, limiter and discriminator.

15 Claims, 3 Drawing Sheets

5,537,676

METHOD OF RECEIVING DATA SIGNALS IN A RADIO TRANSCEIVER USING LOW COST COMPONENTS

FIELD OF THE INVENTION

This invention relates to the field of radio communications, and in particular to an improvement in the receiver of a data transceiver that can be used in the 928/952 MHz frequency bands.

BACKGROUND TO THE INVENTION

Increasing demand for data communications has created a need for low cost half-duplex transceivers (radios) which operate in the 928/952 MHz frequency bands. In such transceivers, radios are designed such that the offset between the receiver and transmitter frequencies is fixed, such that the transmitter frequency is used as the first intermediate frequency (IF) local oscillator signal for the first mixer of the receiver, which operates as a super heterodyne receiver.

A block diagram of such a receiver is shown in FIG. 1. It may be seen that a reference signal from a reference oscillator 1 is applied to a 928 MHz signal synthesizer 3, which outputs its signal through a loop filter 5 to a voltage controlled oscillator, the output of which is passed into a power splitter 9. A portion of the signal is fed back to the synthesizer 3 to form a phase locked loop with loop filter 5 and voltage controlled oscillator 7, a portion is applied to an output power amplifier 11, and a portion, on line 13, is used as a local oscillator signal for the receiver. The signal portion that passes through power amplifier 11 passes through 928 MHz transmit filter 15, and antenna switch 17 to the antenna.

The 952 MHz signal received by the receiver is passed from the antenna through 952 MHz dielectric filter 19, low noise amplifier 21 and 952 MHz SAW filter 23 to the input of a first mixer 24. In mixer 24, the filtered 952 MHz signal is mixed with the 928 MHz signal from the transmitter, and the difference, a 24 MHz signal, is filtered in a 4-pole 24 MHz crystal filter 25.

The output signal from filter 25 is applied to one input to a second mixer 27, which receives a 23,545 MHz local oscillator signal from crystal controlled oscillator 29. The output of mixer 27 is at a standard IF frequency of 455 KHz., which is filtered in 455 KHz ceramic filter 31. The output signal from filter 31 is limited and discriminated by limiter 33 and discriminator 35. The resulting signal is passed through an audio filter 37 and a data comparator 39 to a data output line.

Thus it may be seen that with the transmit frequency 928 MHz and the receive frequency 952 MHz, each channel pair is arranged such that the offset between the transmit and receive frequencies is 24 MHz. The first local oscillator signal for the receiver is the same frequency as that of the transmitter, resulting in a first IF of 24 MHz. The modulation input to the synthesizer is zero during receive.

A benefit of this architecture is that only one synthesizer is required and since no signal source settling time is required for switching in either transmit or receive mode, the switching time can be fast.

However, this architecture has the disadvantage that the first IF frequency is at a non-standard IF frequency, and noise signals can be heterodyned into the second IF frequency. For that reason, a sharp cutoff very expensive IF filter is required, to restrict the first IF signal that enters the second mixer to only the 24 MHz IF signal, and to block any noise signals. The IF filter is typically a custom produced 4-pole crystal filter with a filter frequency equal to the transmit-receive signal offset.

The second IF filter 31 is typically a standard and inexpensive 455 KHz ceramic filter.

SUMMARY OF THE INVENTION

The present invention provides a transceiver that has the aforenoted benefit, but has the additional benefit of using only low cost components for the receiver IF. The first IF filter can be, for example, an inexpensive LC filter.

The circuit is as described with reference to FIG. 1, wherein the first IF signal is generated at the transmit-receive offset frequency, but this is followed by a second conversion to the standard 21.4 MHz IF frequency, which is processed using inexpensive standard components. A notch noise filter is used to remove the noise signal not sufficiently removed by the LC filter prior to the IF signal passing into the second mixer.

In accordance with an embodiment of the invention, a method of receiving a data signal in a radio transceiver comprised of passing an input receive signal through an input bandpass filter having a bandwidth sufficient to reject signals with frequencies equal to or greater than the receive signal frequency plus a first intermediate frequency (IF) signal frequency plus a first standard IF signal frequency and also to reject signals with frequencies less than the receive signal frequency minus twice the first IF frequency, downconverting the input filter filtered input receive signal by the transmit frequency to produce the first IF signal, filtering the first IF signal in an LC filter, mixing the filtered first IF signal with a local oscillator signal having a difference frequency therefrom which is equal to the first standard IF frequency to produce the first standard IF signal, filtering the first standard IF signal in a standard IF filter, downconverting the filtered first standard IF signal to a second standard IF frequency signal, and filtering, limiting and discriminating the second standard IF frequency signal by a standard filter, limiter and discriminator.

Preferably, the method includes notch filter blocking the first IF signal at an image frequency which would be downconverted to the frequency of the first standard IF signal.

In accordance with another embodiment, a method of receiving a data signal in a radio transceiver is comprised of mixing an input signal in a first mixer with a transmitter carrier signal to generate a first intermediate frequency (IF) signal, filtering the first IF signal in an LC filter, applying the filtered first IF signal to a second mixer, applying a first local oscillator signal to the second mixer, the first local oscillator signal frequency being offset from the frequency of the filtered first IF signal by a first standard IF frequency, filtering the first standard IF signal in a standard IF filter, mixing the first standard IF signal in a third mixer with a second local oscillator signal that is offset from the first standard IF signal by the frequency of a second standard IF signal to produce a second standard IF signal, filtering the second standard frequency IF signal in a standard IF filter, and limiting and discriminating the second standard IF signal to produce an output signal.

In accordance with another embodiment, a transceiver is comprised of apparatus for receiving an input signal, a first apparatus for generating a transmit carrier signal, a first mixer for receiving a portion of the transmit carrier signal and for mixing it with the input signal to produce a downconverted first IF signal, an LC filter for passing the first IF signal, a first local oscillator having a frequency offset from the first IF signal by a first standard IF frequency, a second mixer for receiving an output signal of the first local oscillator and mixing it with the filtered first IF signal to produce a first standard IF signal, a first standard filter for passing the first standard IF signal, a second local oscillator having a frequency offset from the first standard IF signal by a second standard IF signal, a third mixer for mixing an output signal of the second local oscillator signal and mixing it with the filtered first standard IF signal to produced a second standard IF signal, a second standard filter for passing the second standard IF signal, and apparatus for discriminating the filtered second standard If signal to produce an output signal.

The earlier described benefit of the prior art system is achieved at substantially lower cost by the use of the above-described embodiments.

BRIEF INTRODUCTION TO THE DRAWINGS

A better understanding of the invention will be obtained by reading the description of the invention below, with reference to the following drawings, in which.

DETAILED DESCRIPTION OF PREFERRED EMBODIMENT

Figure 1:
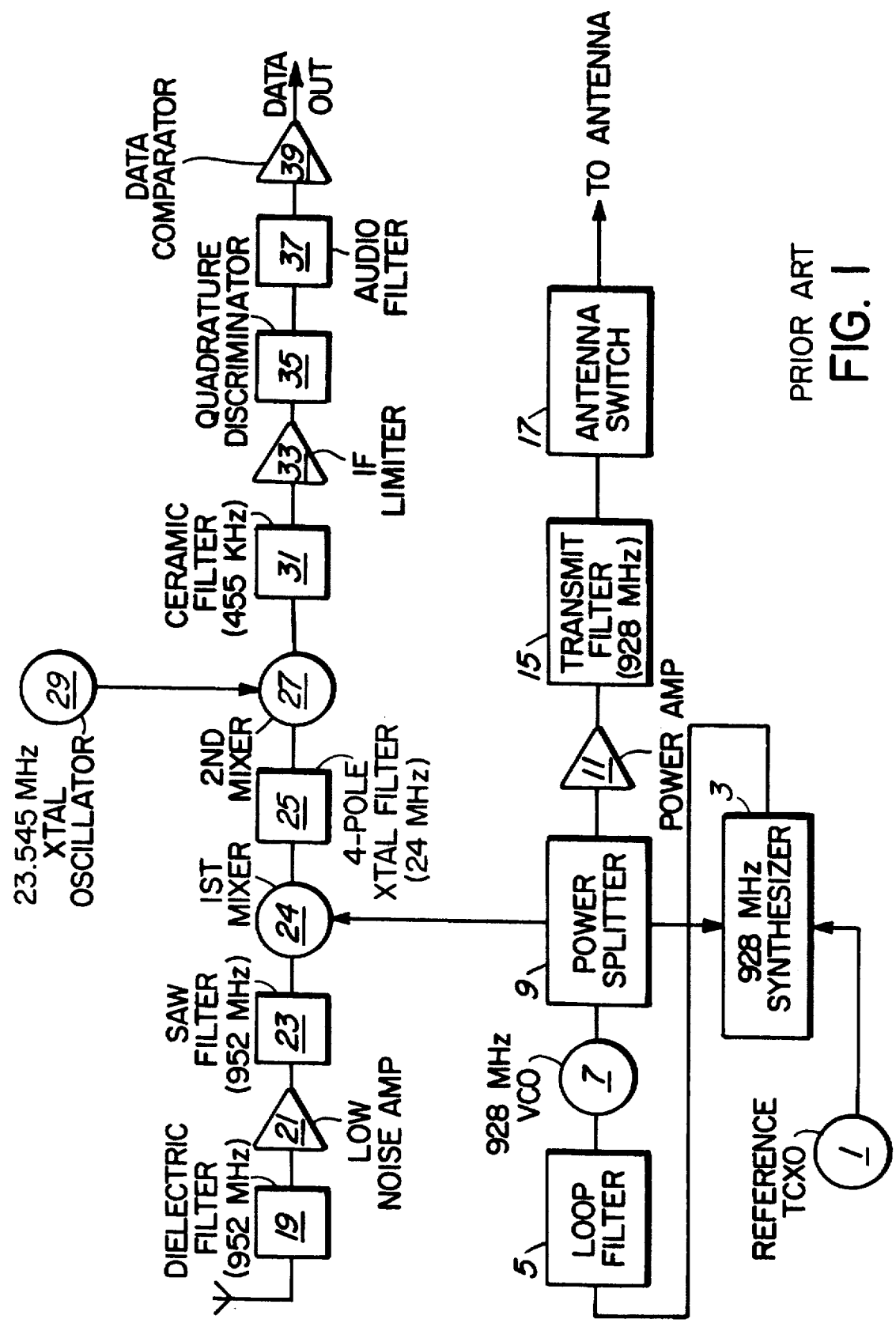
FIG. 1 is a block diagram of a transceiver in accordance with the prior art.
Figure 2:
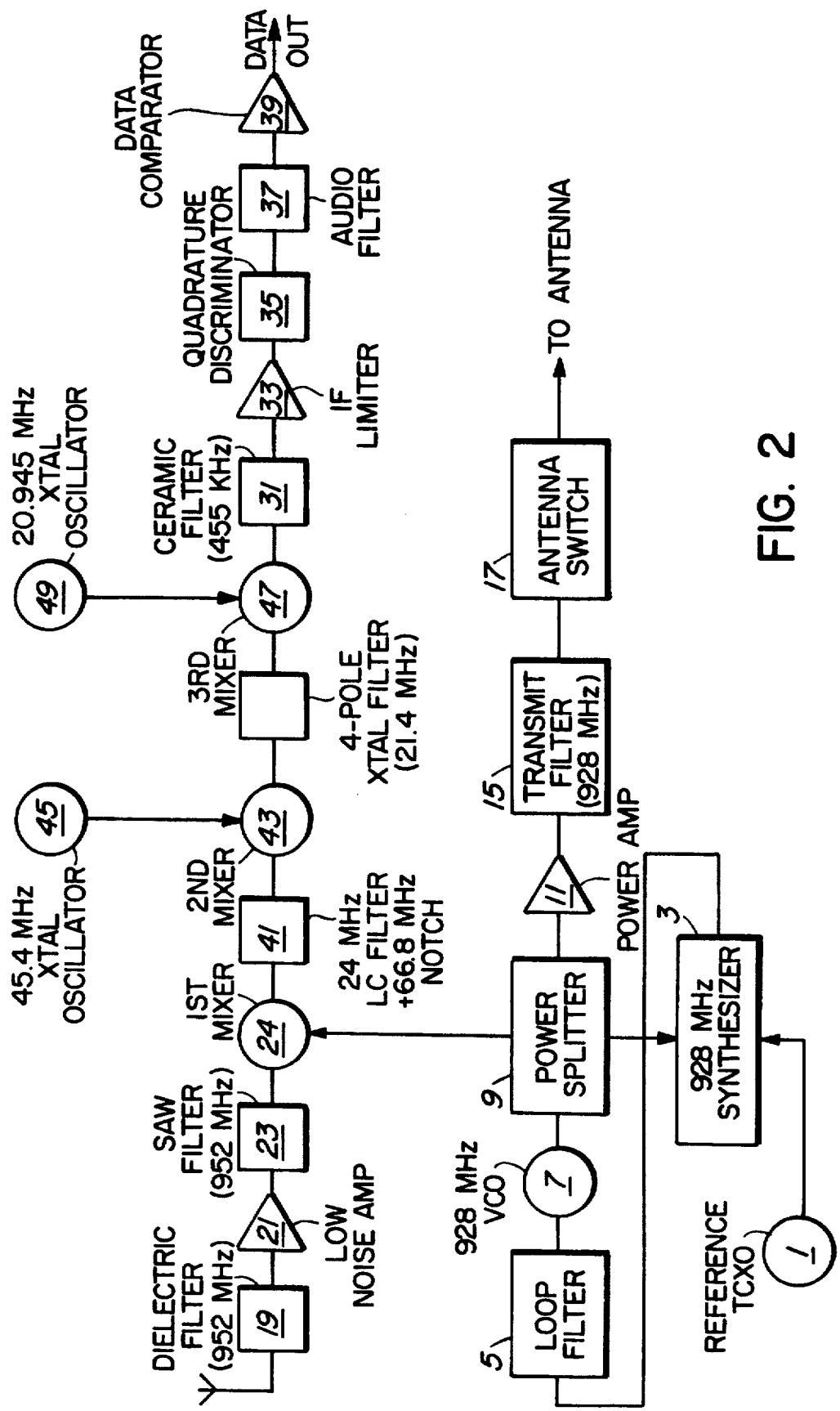
FIG. 2 is a block diagram of a transceiver in accordance with a preferred embodiment of the present invention.

Turning now to FIG. 2, the portion of FIG. 2 which is identical to FIG. 1 is similarly labeled.

The first mixer 24 converts the input signal from the 952 MHz SAW filter 23 to 24 MHz, the offset between the transmit and receive signal, as in the prior art system of FIG. 1. However in the present invention, instead of an expensive 4-pole crystal filter, an inexpensive simple LC filter is used to pass the output signal of the first mixer 24. The filtered signal is applied to an input of a second mixer 43, and a local oscillator signal generated by a 45.5 MHz oscillator 45 is applied to another input of the mixer. The result is a second IF signal at a standard frequency of 21.4 MHz.

It should be noted that the local oscillator 45 could be at a different frequency if it is subtracted from the input IF signal in mixer 43 to a different standard second IF signal, such as at 10.7 MHz.

A standard widely available 4-pole crystal filter at the standard IF frequency, e.g. 21.4 MHz, passes the 21.4 MHz signal presented to it, and the resulting output signal is applied to mixer 47. A 20.945 MHz local oscillator signal generated in crystal controlled local oscillator 49 is applied to mixer 47. The resulting 455 KHz final IF signal is passed through 455 KHz ceramic IF filter 31, and its output signal is further processed as described earlier with respect to the prior art.

Figure 3:
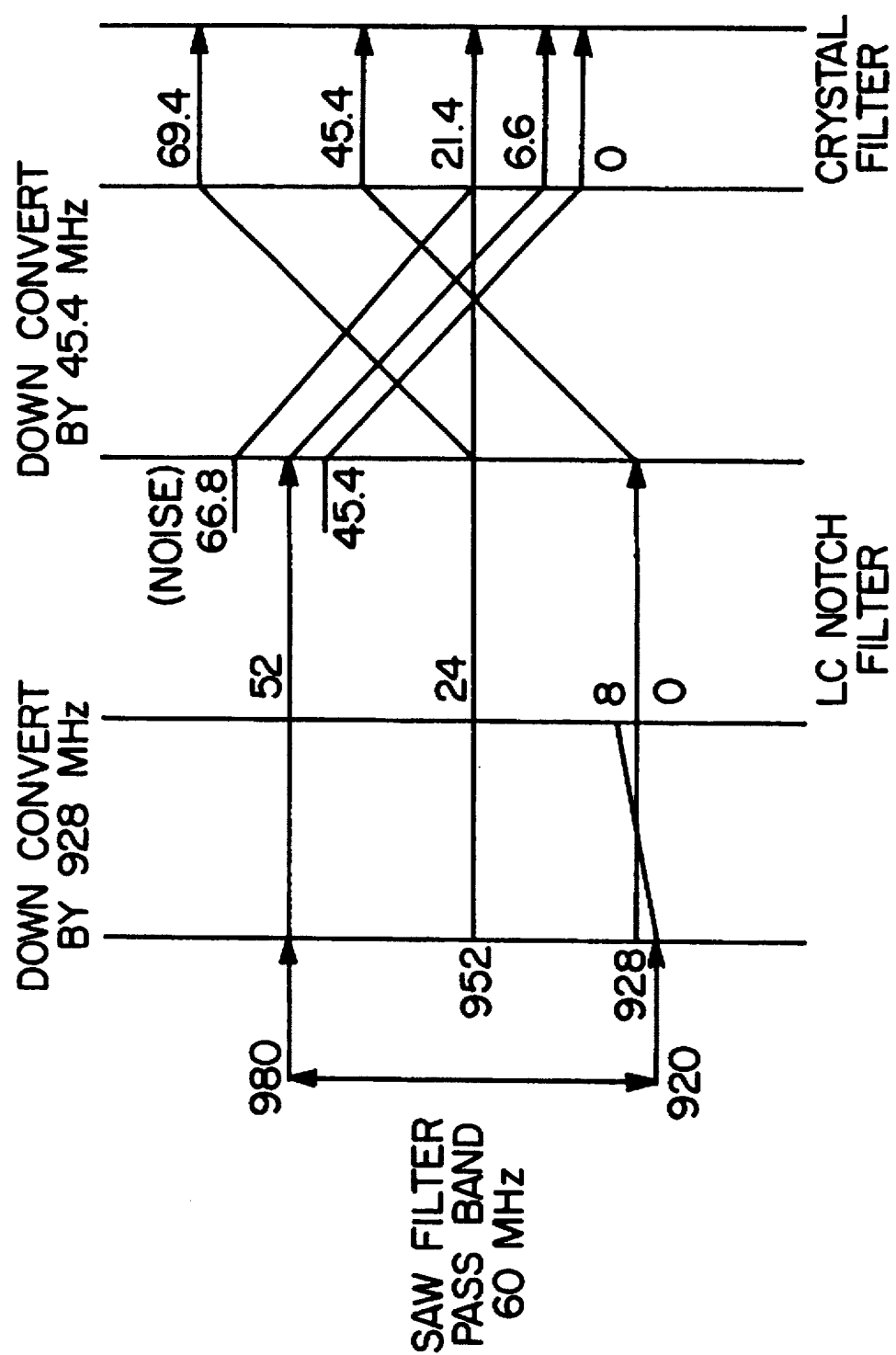
FIG. 3 is a frequency conversion diagram used to understand operation of the embodiment described with reference to FIG. 2.

The dielectric and SAW filters 19 and 23 together provide a passband with a bandwidth of approximately 60 MHz, between 980 and 920 MHz. The sequence of frequency conversions and the filtering will be described below with respect to FIG. 3.

After amplification and filtering, the signals presented to mixer 24 are downconverted by 928 MHz. Thus, wanted signals at 952 MHz are converted to 24 MHz. 980 MHz signals (the highest frequency within the filter pass band) are downconverted to 52 MHz, which is then the upper frequency of converted signals following mixer 24.

928 MHz signals are downconverted to 0 MHz, and signals between 928 and 920 MHz (the lowest frequency within the filter pass band) "fold over" to yield signals in the range 0 to 8 MHz respectively. The "image" frequency of the mixer 24 is 904 MHz (resulting from 928 MHz-24 MHz), and image signals are rejected by the filters 19 and 23.

The output IF signal of the mixer 23 is passed by LC filter 45. This filter is preferred to have a rejection notch at 66.8 MHz, for the reason to be explained later below.

The LC filtered IF signal is then mixed in mixer 43 with a 45.4 MHz local oscillator signal. Signals between 52 MHz (the highest converted frequency within the front end pass band) and 45.4 MHz are downconverted to between 6.6 and 0 MHz. Signals between 45.4 MHz and 0 MHz are converted to the range of 0 MHz and 45.4 MHz respectively. This band contains the wanted signal (24 MHz), which is thus converted to 21.4 MHz, a widely used IF.

The image frequency of mixer 43 is 66.8 MHz (being 45.4 MHz +21.4 MHz). The bandpass filters 19 and 23 eliminate signals that would have been downconverted to this frequency, and the 66.8 MHz notch in the LC filter 45 virtually eliminates down conversion of 66.8 MHz mixer input noise, which would be downconverted to the 21.4 MHz IF.

Thus it may be seen that by the use of commonly available components in a double IF conversion architecture, and an inexpensive LC filter with a notch, the earlier described benefit of the prior art system is achieved at substantially lower cost.

A person understanding this invention may now conceive of alternative structures and embodiments or variations of the above. All of those which fall within the scope of the claims appended hereto are considered to be part of the present invention.

I claim:

1. A method of receiving a data signal in a radio transceiver comprising:

(a) passing an input receive signal through an input bandpass filter having a bandwidth sufficient to reject signals with frequencies equal to or greater than a frequency of the receive signal plus a first intermediate frequency (IF) signal frequency plus a first standard IF signal frequency and also to reject signals with frequencies less than the receive signal frequency minus twice the first IF signal frequency, (b) downconverting the input bandpass filter filtered input receive signal by the transmit frequency to produce the first IF signal, (c) filtering the first IF signal in an LC filter, (d) mixing the filtered first IF signal with a local oscillator signal having a difference frequency therefrom which is equal to the first standard IF signal frequency to produce the first standard IF signal, (e) filtering the first standard IF signal in a standard IF filter, (f) downconverting the filtered first standard IF signal to a second standard IF frequency signal, (g) filtering, limiting and discriminating the second standard IF frequency signal by a standard filter, limiter and discriminator, and (h) notch filter blocking the first IF signal at an image frequency which would be downconverted to the frequency of the first standard IF signal.

2. A method as defined in claim 1 in which the input receive signal is at about 952 MHz and including the steps of synthesizing a transmit frequency signal at about 928 MHZ, the first IF signal being at about 24 MHz, the first mixing step being effected using a first local oscillator signal of about 45.4 MHz to produce said first standard IF signal of about 21.4 MHz, the first standard IF signal downconverting step being effected using a second local oscillator signal of about 20.945 MHz to produce the second standard IF frequency signal of about 20.945 MHz.

3. A method as defined in claim 2 in which the notch filter filters out noise of about 66.8 MHz.

4. A method of receiving a data signal in a radio transceiver comprising:

(a) mixing an input signal in a first mixer with a transmitter carrier signal to generate a first intermediate frequency (IF) signal, (b) filtering the first IF signal in an LC filter, (c) applying the filtered first IF signal to a second mixer, (d) applying a first local oscillator signal to the second mixer, a frequency of the first local oscillator signal being offset from the frequency of the filtered first IF signal by a first standard IF frequency, to produce a first standard IF signal, (e) filtering the first standard IF signal in a standard IF filter, (f) mixing the first standard IF signal in a third mixer with a second local oscillator signal that is offset from the first standard IF signal by the frequency of a second standard IF signal to produce the second standard IF signal, (g) filtering the second standard frequency IF signal in a standard IF filter, (h) limiting and discriminating the second standard IF signal to produce an output signal, and (i) noise filtering an image frequency signal in the first IF signal which image frequency signal is at a frequency which would be downconverted by the first mixer to a frequency of the first IF signal.

5. A method as defined in claim 4 in which the first and second standard IF signals are at about 21.4 MHz and about 455 KHz respectively.

6. A method as defined in claim 4 in which the first IF signal is at about 24 MHz and the first standard IF signal is at about 21.4 MHz respectively.

7. A method as defined in claim 6 including first and second local crystal oscillators for generating the first and second local oscillator signals respectively.

8. A method as defined in claim 4 including applying said transmit carrier signal of about 928 MHz and applying said input signal of about 952 MHz.

9. A method as defined in claim 8 in which the first IF signal is at about 24 MHz and the first standard IF signal is at about 21.4 MHz respectively.

10. A method as defined in claim 9 including crystal first and second local oscillators for generating the first and second local oscillator signal.

11. A method as defined in claim 10 in which the first standard IF signal is filtered in a standard 4-pole crystal IF filter.

12. A transceiver comprising:

(a) means for receiving an input signal, (b) a first means for generating a transmit carrier signal, (c) a first mixer for receiving a portion of the transmit carrier signal and for mixing it with the input signal to produce a downconverted first IF signal, (d) an LC filter for passing the first IF signal, (e) a first local oscillator having a frequency offset from the first IF signal by a first standard IF frequency, (f) a second mixer for receiving an output signal of the first local oscillator and mixing it with the filtered first IF signal to produce a first standard IF signal, (g) a first standard filter for passing the first standard IF signal, (h) a second local oscillator having a frequency offset from the first standard IF signal by a second standard IF signal, (i) a third mixer for mixing an output signal of the second local oscillator signal and mixing it with the filtered first standard IF signal to produce the second standard IF signal, (j) a second standard filter for passing the second standard IF signal, (k) means for discriminating the filtered second standard IF signal to produce an output signal and (l) a notch filter for noise filtering the first IF signal at an image frequency which is above the first standard IF frequency by the frequency of the first local oscillator.

13. A transceiver as defined in claim 12 in which the local oscillators are crystal controlled, and in which the first standard filter is a 4-pole crystal filter.

14. A transceiver as defined in claim 13 in which the first and second standard IF signals are at about 21.4 MHz and 455 KHz respectively.

15. A transceiver as defined in claim 14 in which the input signal is at about 952 MHz, a frequency of the transmit carrier signal is at about 928 MHz, and the first IF signal is at about 24 MHz.

* * * * *